United States Patent
Natarajan et al.

(10) Patent No.: US 11,526,648 B2
(45) Date of Patent: Dec. 13, 2022

(54) ACCELERATING LATENT DEFECTS IN SEMICONDUCTOR DEVICES

(71) Applicant: INTEL CORPORATION, Santa Clara, CA (US)

(72) Inventors: Suriyaprakash Natarajan, Sunnyvale, CA (US); Abhijit M. Sathaye, Portland, OR (US); Suvadeep Banerjee, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 751 days.

(21) Appl. No.: 16/361,848

(22) Filed: Mar. 22, 2019

(65) Prior Publication Data

US 2020/0302028 A1 Sep. 24, 2020

(51) Int. Cl.
*G06F 30/398* (2020.01)
*G06F 30/20* (2020.01)

(52) U.S. Cl.
CPC ............ *G06F 30/398* (2020.01); *G06F 30/20* (2020.01)

(58) Field of Classification Search
CPC ...... G06F 30/398; G06F 30/20; G06F 30/367; G01R 31/2817; G01R 31/2855
See application file for complete search history.

(56) References Cited

U.S. PATENT DOCUMENTS

| 10,048,312 B1* | 8/2018 | Hoffmeyer | G01R 31/2817 |
| 2014/0032188 A1* | 1/2014 | Manouvrier | G06F 17/10 703/2 |
| 2016/0069950 A1* | 3/2016 | Chen | G01R 31/2626 324/750.05 |

OTHER PUBLICATIONS

Banerjee, Suvadeep and Suriyaprakash Natarajan, "Infant Mortality Tests for Analog and Mixed-Signal Circuits," IEEE Computer Society, 34th VLSI Test Symposium (VTS), 2016. 6 pages.

* cited by examiner

*Primary Examiner* — Nha T Nguyen
(74) *Attorney, Agent, or Firm* — Schwabe, Williamson & Wyatt P.C.

(57) ABSTRACT

Techniques are described for systematically and efficiently converting or otherwise accelerating latent defects in semiconductor devices into gross defects by applying appropriate defect acceleration stimulus to the semiconductor devices. Techniques are also described for evaluating test patterns to determine their effectiveness in accelerating the transition of latent defects to gross defects. This evaluation effectively allows various stress patterns to be graded or ranked, so that an optimal or high-confidence one can be selected. Such grading of possible stress patterns increases the probability that a given latent defect will escalate or otherwise manifest.

22 Claims, 7 Drawing Sheets

ACCELERATING LATENT DEFECTS IN SEMICONDUCTOR DEVICES

BACKGROUND

Some integrated circuit devices may be produced with latent defects that, unlike gross defects, do not immediately manifest when the device is tested for the first time. The type of latent defect can vary according to an architecture and performance parameters of a given device. For example, conductive structures that are spaced close to one another may be prone to electrical shorting from electromigration that occurs over a period of device operation and that causes the movement of conductive material through surrounding insulator material from one structure to another. Foreign material or a crystallographic defect can lead to the breakdown of a dielectric layer between conductive plates of a capacitor. Other types of defects and defect/device combinations will be appreciated. One technique for preventing defective integrated circuit devices from being installed in an end-user device is to expose the integrated circuit devices to stresses that accelerate the maturation of latent defects into gross defects. Once the defects complete formation, they can be detected by a test during the manufacturing process. The stresses are sometimes provided at elevated temperatures and supply voltages, and involve the application of voltage patterns that toggle some of the wires between standard cells between the binary values of 1 and 0. Toggling wires at elevated temperatures is sometimes referred to as burn-in. Unfortunately, a percentage of fabricated circuits invariably pass all such performance tests only to later fail during an application run at a customer site. Upon return to the manufacturer, the circuit fails the very same performance tests that it passed prior to shipment to the customer. To this end, there remain a number of non-trivial issues associated with achieving effective stress testing.

Figure 1A:
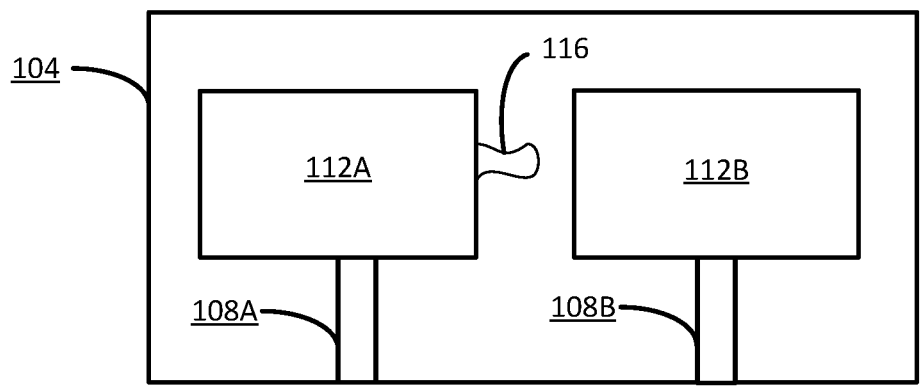
FIGS. 1A and 1B are schematic illustrations showing the progressive growth of a latent defect into a gross defect.

The figures depict various embodiments of the present disclosure for purposes of illustration only. Numerous variations, configurations, and other embodiments will be apparent from the following detailed discussion.

DETAILED DESCRIPTION

Techniques are described for systematically and efficiently converting or otherwise accelerating latent defects in semiconductor devices into gross defects by applying appropriate defect acceleration stimulus to the semiconductor devices. Techniques are also described for evaluating test patterns to determine their effectiveness in accelerating the transition of latent defects to gross defects. This evaluation effectively allows various stress patterns to be graded or ranked, so that an optimal or high-confidence one can be selected. Such grading of possible stress patterns increases the probability that a given latent defect will accelerate or otherwise manifest so that it can be detected and the affected die removed in other stages of the manufacturing process. These techniques can therefore improve the performance, reliability, and/or quality of integrated circuit (IC) devices by reducing the likelihood that these integrated circuit devices include latent defects that will transform into gross defects upon exposure to normal operating conditions within an end-user device or application. Other advantages of some embodiments include the reduction in manufacturing test costs and faster improvement of manufacturing yield as latent defect mechanisms are identified and addressed.

General Overview

Integrated circuits and other semiconductor devices may sometimes include defects that are formed (or partially formed) during the fabrication process. Some defects are random in nature. For example, some defects are formed due to process variation or accidental deposition of foreign material during integrated circuit fabrication. Other defects are formed systematically during manufacturing. One example of a systematically formed defect is that of printing/patterning error due to a defect on a photolithographic mask. Regardless of the cause, defects can be grouped into two broad categories: gross defects and latent defects.

Gross defects can be detected during device fabrication or during testing of a fabricated device (or completed module) using inspection, structural test techniques, and functional test techniques. These techniques can include, for example, temperature, voltage, and current patterns that are applied to the integrated circuit device. One technique for worsening gross defects is known as burn-in. Burn-in stresses typically are performed by subjecting die and/or modules to elevated temperature and voltage, and switching (or "toggling") conductive lines (also referred to as wires) connecting groups of circuits (sometimes referred to as cells) between the Boolean states of 0 to 1 and 1 to 0 using a test pattern. For example, a common criteria for quantifying the effectiveness of manufacturing burn-in for latent defect acceleration is the percentage of wires in an integrated circuit (IC) that are switched (or "toggled") between the Boolean states of 0 to 1 and 1 to 0 by a test pattern. The higher the percentage of wires that are toggled, the more effective and thorough the burn-in stress is thought to be. Because these tests are applied to an integrated circuit device prior to installation in an end-user device (e.g., a mobile computing device, a server), gross defects accelerated by burn-in can be removed at subsequent test steps. A significant problem, however, is that standard burn-in practices may not be able to transform certain latent defects to gross defects. As will be appreciated in light of this disclosure, this is because the stressing stimulus utilized does not accurately maximize the stresses on constituent structures within the device that will be experienced in the end-use application. For this reason, integrated circuits that include a latent defect may pass manufacturing tests that apply a regime of robust test patterns, only to later fail in a given application that includes untested stimulus at customer site.

Figure 1B:
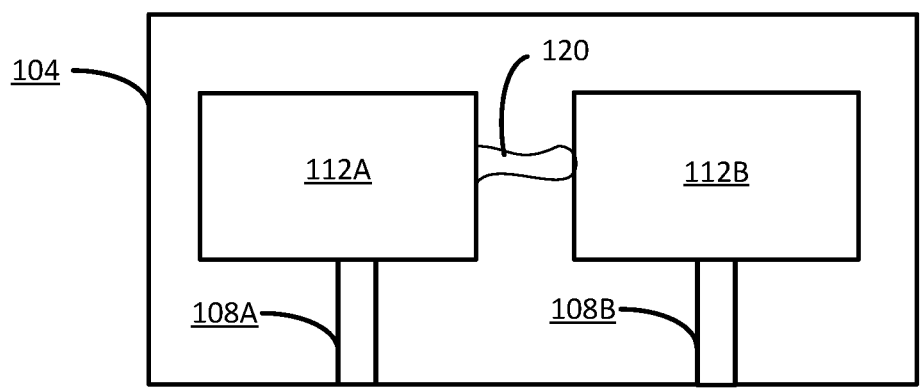

One example illustration of a latent-to-gross defect transformation scenario is shown in FIGS. 1A and 1B. Turning first to FIG. 1A, a portion 100 of a back end of line ("BEOL") portion of an integrated circuit device is shown. Interlayer dielectric (ILD) 104 encapsulates conductive vias 108A, 108B connected to conductive lines 112A, 112B. Compositions of ILD 104 can include any of a variety of dielectric materials including, but not limited to, silicon dioxide, silicon nitride, among others. Vias 108A, 108B and conductive lines 112A, 112B can be fabricated from any of a number of materials used for BEOL structures, including aluminum and/or copper, and may also include one or more layers (e.g., liners, barrier layers). For example, conductive liners such as tantalum nitride or titanium nitride may be disposed between an aluminum/copper core and the ILD layer 104. These layers have been omitted in the depiction of FIGS. 1A, 1B for clarity of depiction.

Also shown in FIG. 1A is a partially formed conductive filament 116, which is an undesired artifact of the manufacturing process. The conductive filament 116 extends from the conductive line 112A into a portion of the ILD 104 between conductive lines 112A and 112B. As will be appreciated, the conductive filament 116 is a latent defect because it is not in electrical contact with the adjacent conductive line 112B and therefore has not yet formed an electrically detectable short between the adjacent conductive lines 112A, 112B. Normal burn-in conditions of elevated temperature and voltage toggling of transistor gates (i.e., logic transitions of 0 to 1 and 1 to 0) are unlikely to cause the conductive filament 116 to develop into a detectable gross defect. This is because conductive filament 116 is more likely to grow through the mechanism of dielectric breakdown, which would be experienced during customer use over a long period of time. FIG. 1B illustrates the resulting structure after such dielectric breakdown has occurred, where the ILD 104 between metal of the filament 116 and conductive line 112B loses its insulating property due to a high electric field, until a short-circuit between 112A and 112B is formed. As will be appreciated in light of this disclosure, standard wire toggling during in burn-in is generally less likely to provide the current sufficient to cause such high electric field and dielectric breakdown. In a more general sense, toggling does not reliably and consistently provide the conditions needed to transform any number of latent defects, particularly those in structures other than wires, into gross defects. So, as illustrated by the preceding scenario, one deficiency in traditional defect testing and/or acceleration techniques (e.g., burn-in) is a lack of proper stress coverage with respect to many different types of latent defects.

Another deficiency in traditional defect testing and/or acceleration techniques is the lack of systematic coverage for structures other than wires. For example, while toggling wires of a cell making up a portion of an integrated circuit from 1 to 0 and back to 1 may cause some current flow conditions, there is no guarantee that the resulting current flow will be the correct magnitude needed for proper stressing of the components within the circuit; nor is there any guarantee that the resulting current flow will manifest at the right nodes in the circuit (such as at the gate and drain of a transistor device within the cell under test). This is because toggling is not designed or otherwise intended to maximize stress stimuli at the individual component (e.g., transistor, diode, resistor, capacitor, level, interconnect, etc). As a result, standard toggling and burn-in does not systematically and reliably accelerate many types of latent defects into gross defects, particularly for latent defects associated with structures (e.g., individual devices/components and interconnects) within a cell.

Thus, a more reliable and systematic, more effective and more efficient approach is to apply stress conditions (e.g., temperature, current, voltage, and changes in the magnitude and polarity thereof) that are known to transform latent defects into gross defects using conditions that systematically and intentionally stress desired structures throughout a cell or circuit for one or more types of latent defects. For example, while elevated voltage may be able to transform some types of latent defects into gross defects, simply applying an elevated voltage to a power supply line (e.g., to toggle the line from 0 to 1) may not necessarily cause an elevated voltage at individual structures (e.g., transistor, diodes, capacitors, resistors, inductors, interconnects) therein. Instead, transforming a latent defect to a gross defect can be facilitated by applying a stress pattern that ensures a high-voltage (or another accelerating stress appropriate to an expected defect) at the features or nodes that make up the various structures of a given integrated circuit (e.g., a gate, a source, a drain, a dielectric layer, a terminal, an anode, a cathode). For instance, a stress pattern may include, for example, simultaneously applying a maximum high voltage to the drain of a transistor and a low voltage to the gate of that transistor, so as to reverse bias and stress the drain junction of that transistor.

Figure 1C:
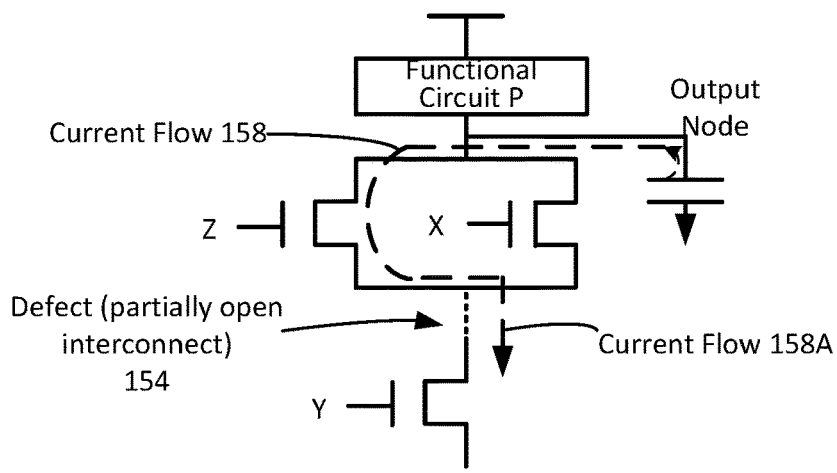
FIGS. 1C, 1D, and 1E are schematic illustrations indicating different current flows through a transistor, some of which can be effective for defect detection (FIGS. 1C, 1D) but not defect acceleration, and one of which (FIG. 1E) is less effective for defect testing and more effective for defect acceleration, in accordance with an embodiment of the present disclosure.
Figure 1D:
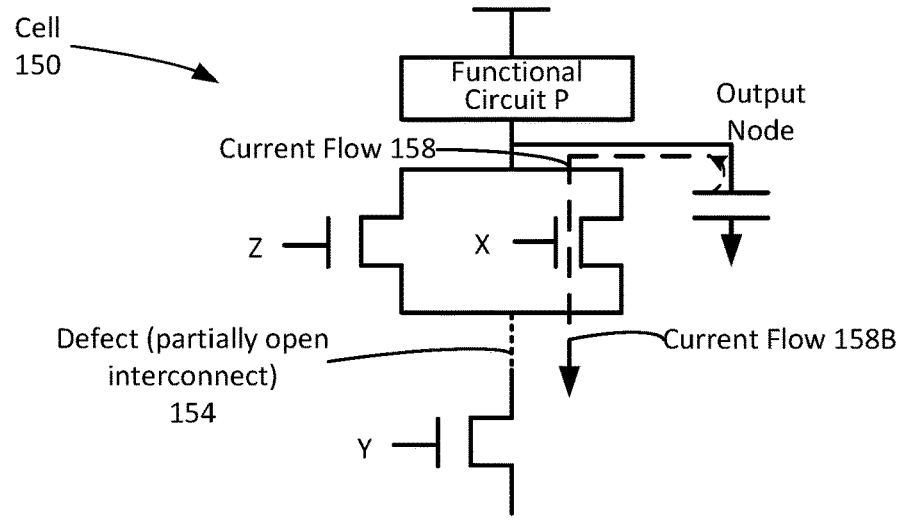
Figure 1E:
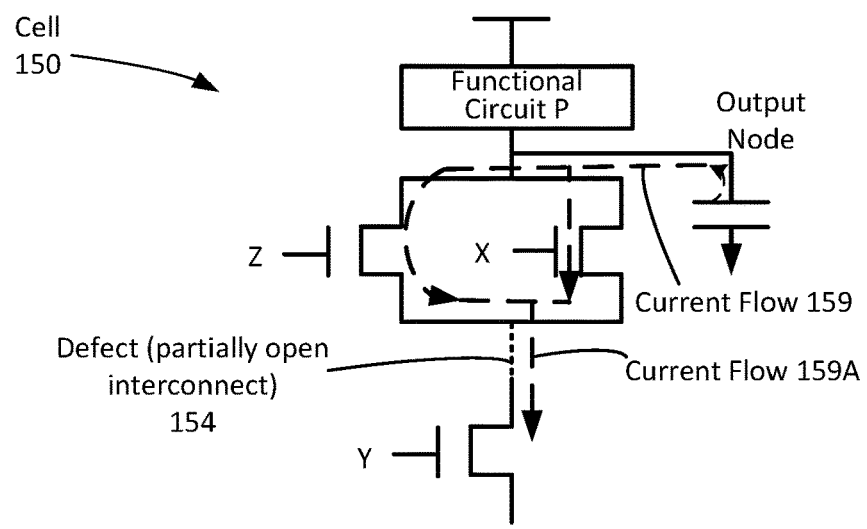

In some examples, techniques described herein use defect accelerating current and/or voltage patterns that are counterintuitive to conventional defect testing methodology. This is because conditions to worsen latent defects are generally quite different from those to observe completed defects. FIGS. 1C, 1D, and 1E illustrate such an example scenario, in which a standard cell 150 includes a functional circuit P (e.g., which can be any functional circuit, such as a transistor array, pull-up circuit, logic circuit, filter circuit, etc) having its output node operatively coupled to a conditional switch. The conditional switch includes three transistors X, Y, and Z with corresponding inputs. Although the functionality of the cell is arbitrary and may vary from one example case to the next, in this particular example case, a signal at the output node can be varied depending on the switching logic applied to the X, Y, and Z inputs. For instance, if none of transistors X, Y, and Z are ON, then the signal at the output node is generally the signal provided by functional circuit P; alternatively, if either or both of transistors X or Z is ON along with transistor Y, then the signal at the output node is effectively modified by the signal connected to the source/drain of transistor Y. Again, the actual purpose and function of the circuitry under test is less relevant here than the stress testing applied so as to accelerate latent defects.

As also shown in the example cases of FIGS. 1C, 1D, and 1E, an interconnect 154 having a latent defect is also present in the cell 150, as indicated by a dashed line. In particular, the interconnect 154 is partially intact but also partially open so as to provide a potential latent defect. While the interconnect 154 may conduct current and readily pass standard toggle-based testing, it may eventually open completely under certain stress conditions that are not manifested during standard toggle-based testing. Thus, the latent defect of interconnect 154 will likely go undetected if only standard toggle-based testing is utilized.

FIGS. 1C and 1D show current flows through the cell 150 that are effective for detecting a fully formed open in interconnect 154, but not necessarily effective for accelerating a latent defect. Namely, current 158 causes currents 158A and 158B to flow through respective transistor Z and/or X to transistor Y. Even with a partially open interconnect 154, the currents 158A and/or 158B will still flow to transistor Y. For standard toggling-based testing, these currents 158A and/or 158B are relatively low, and therefore unlikely to accelerate the partial open of interconnect 154 into a complete open. Thus, while standard toggling-based tests are good for detecting a completely open interconnect (or other fully formed defect), they are not good for detecting a latent defect such as a partial open. To this end, and as noted above, conditions to worsen latent defects are generally quite different from those to observe completed defects. In some cases, it is possible for the currents 158A and/or 158B to be different due to the partially open interconnect 154 having a sufficiently different resistance that will cause the signal at the output node to be outside an expected threshold (e.g., standard resistive current divider theory). But standard-based toggling tests do not test for such changes in resistance; rather, standard toggling tests are binary in nature—the circuit either conducts or it doesn't. Moreover, such subtle changes in resistance have equally subtle manifestations in changes in current, and would thus likely be very difficult to accurately and consistently detect in large scale production, especially without incurring a relatively high percentage of false positives.

FIG. 1E illustrates a stress pattern that includes an optimized or otherwise relatively high current flow 159 sufficient for accelerating the partially open defect of interconnect 154 to a complete open. Once fully opened, the defect will manifest in subsequent testing, whether that testing involves a continuation of high current stress testing and/or subsequent standard toggling-based testing such as discussed with reference to FIGS. 1C and 1D. As shown, the current flow 159 divides and flows through both of transistors X and Z, and then combine again to provide current 159A (same as current 159, assuming no leakage) that passed to transistor Y by way of the interconnect 154. The enhanced current 159A is designed accelerate partial opens into a complete open, so that the current 159 and 159A stop flowing thereafter.

Numerous other scenarios (e.g., different devices, different defects) where one or more tailored stress patterns are applied that maximize or otherwise sufficiently induce enhanced electrical activity through one or more portions of an integrated circuit, as will be appreciated.

To this end, developing stress patterns that systematically and efficiently transform different types of latent defects in cells and in wires to corresponding detectable gross defects on different configurations of semiconductor devices can improve, and/or reliability (e.g., reduce in-field failures), quality, and manufacturing yield while simultaneously reducing fabrication and test costs. Furthermore, systematically evaluating the stress criteria to be applied in light of the specific semiconductor devices within an integrated circuit enables stress stimuli to be evaluated or "graded" for effectiveness for a given integrated circuit design. This enables accurate modeling of the effectiveness of stress stimuli and a method of objectively gauging the cost effectiveness of stress stimuli. Current burn-in stresses are currently applied without this regard to accelerating specific latent defect mechanisms, without systematically stressing any structures other than wires, and without a recursive grading component that can model an effectiveness of a stress at accelerating one or more types of defects. As a result, latent defects can escape burn-in, increasing a risk of failure in an end-user device or application.

Thus, in accordance with some embodiments of the present disclosure, techniques are described for systematically converting latent defects into gross defects by applying appropriate defect acceleration techniques to semiconductor devices and corresponding interconnections of an integrated circuit. Techniques are also described for evaluating and grading test patterns to determine their effectiveness in accelerating the transition of latent defects to gross defects. One advantage of the techniques, according to an embodiment, includes improving the performance, reliability, and/or quality of integrated circuit devices by reducing the likelihood that these integrated circuit devices include undetected latent defects. Other advantages include, as will be appreciated, the reduction in manufacturing test costs and improved manufacturing yield as latent defect mechanism are identified and addressed. In some embodiments, stress patterns are devised to accelerate the transformation of latent defects into gross defects so that more traditional test methodologies can detect the newly formed gross defects (e.g., by producing an unexpected result in response to test stimuli).

Stress Stimuli for Semiconductor Devices

As mentioned above, the conditions for transforming latent defects into detectable gross defects are different from the conditions for simply observing gross defects. In other words, stress stimuli needed to accelerate the transition of latent defects to gross defects are different from test stimuli used to simply detect gross defects. Current methodologies generally apply test stimuli (e.g., the toggling of wires between logical 1 and logical 0 and back) repeatedly at elevated temperature and power supply (rail) voltage on the mistaken assumption that this regimen is sufficient to convert latent defects to gross defects.

Developing effective stress stimuli that can accelerate the transformation of latent defects to gross defects systematically and throughout a circuit (including within cells) during manufacturing (thus reducing the frequency of occurrence of so-called "field failures") involves an understanding of the electrical and temperature conditions under which different types of structures (e.g., transistors, diodes, passive components, interconnects, dielectric layers, PN junctions, etc) will be stressed during normal operation in a given application, so as to accelerate the development of various types of defects (if present).

For example, multiple failure mechanisms in a metal oxide semiconductor (MOS) transistor can be stressed by applying voltage conditions that cycle semiconductor devices (including passive devices like capacitors and inductors) between extremes of the voltage rating for the device applied first to one transistor terminal (e.g., a source or a drain) and then the other. Note that while MOS transistors are used in various examples herein, any number of transistor technologies can benefit from the techniques provided herein, such as bipolar junction transistors (BJTs), heterojunction bipolar transistors (HBTs), insulated gate BJTs, field effect transistors (FETs), MOS field effect transistors (MOSFETs), to name a few examples, and as will be appreciated.

Figure 2A:
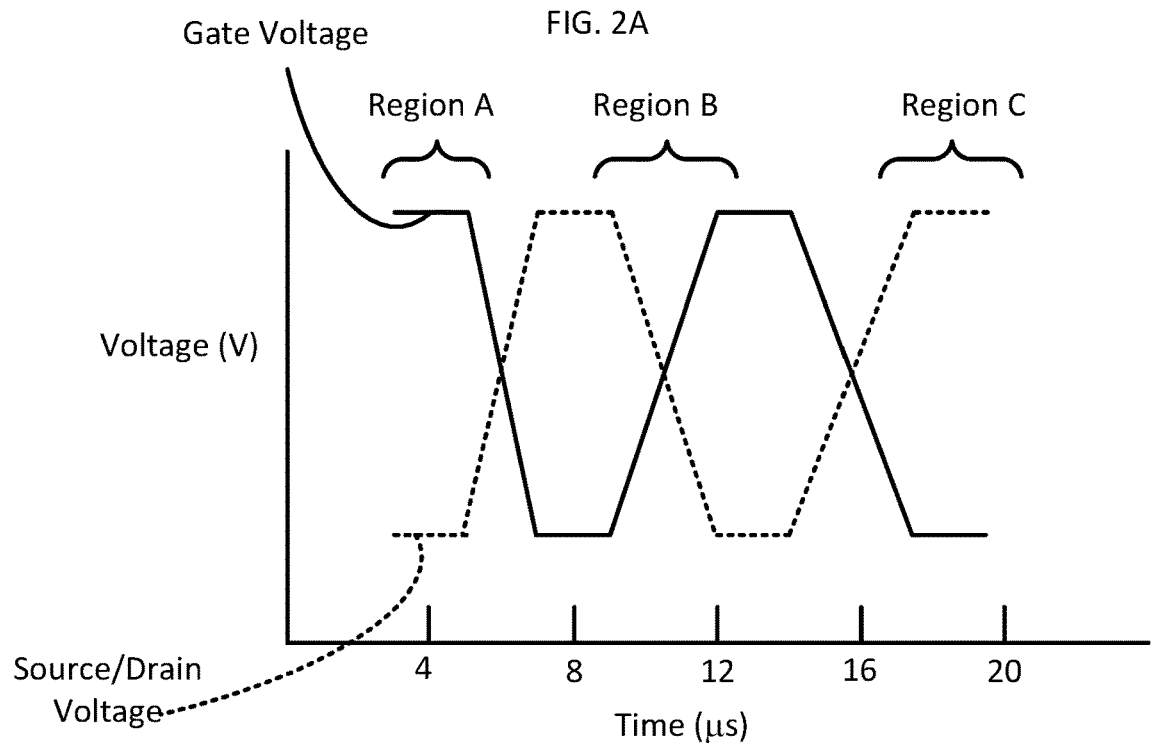
FIG. 2A is an illustration of a stress stimulus scheme in which a gate voltage and source and/or drain voltage are systematically and simultaneously cycled to transform various different types of latent defects in a given transistor into gross defects, in accordance with an embodiment of the present disclosure.

FIG. 2A illustrates an example of such input stress conditions. It will be noted that the voltage pattern illustrated in FIG. 2A differs from burn-in in many regards. For instance, while burn-in toggles wires, the example stress input shown in FIG. 2A maximizes: (1) drain-source current (or collector current for a bipolar junction transistor); drain-source voltage (collector-emitter voltage for BJT); and gate-source voltage (base-emitter voltage for BJT). That is, the example scenario depicted in FIG. 2A illustrates voltage patterns applied to a semiconductor device itself so as to accelerate defects associated with the various structures therein. Stress inputs for other devices (e.g., diodes, resistors, capacitors, inductors, interconnect structures) will be discussed in turn.

The stress pattern illustrated in FIG. 2A is annotated with three regions: Region A, Region B, and Region C. It will be appreciated that these three regions can be applied to a device in any order. Each of these regions is characterized by a particular combination of voltages simultaneously applied to a source region, a drain region, and/or a gate region with a resulting electromagnetic field therebetween. It will be appreciated that absolute values of voltages are not shown in FIG. 2A because these values will change as a function of transistor technology and design. It will however be appreciated that the high and low values of these voltages in each of Regions A, B, and C can approximate (e.g., within +/−10%, +/−20%) a maximum and/or minimum voltage rating for a device, in some examples. It will also be further appreciated that the time scale in FIG. 2A is provided for illustration purposes and may vary depending on device construction and/or device operational rating.

Turning first to Region A, a high gate voltage (e.g., near an upper voltage rating for the device) and low (e.g., near a lower voltage supply for the device) drain-source voltage is applied to MOS transistor so as to create a vertical electrical field having a relatively large magnitude across a gate dielectric layer within the MOS transistor. This strong electrical field activates mechanisms that accelerate development of some types of latent defects. For example, some types of latent defects can be formed during the manufacturing process that create interface traps at gate dielectric interfaces. The trap can be, for instance, metal atoms that migrate into the dielectric material. The combination of a high gate voltage and low drain/source voltage exerts a high inversion bias on the dielectric, which in turn generates more interface traps. Generating more traps can transform some types of latent defect into a gross defect that is detectable during application of the stress or subsequent performance testing. Specific examples of this type of defect include but are not limited to bias temperature instability (BTI) and time-dependent dielectric breakdown (TDDB).

Region B of FIG. 2A illustrates a condition in which thermally activated latent defects can be accelerated. In this region, a non-zero gate voltage and a non-zero source/drain voltage are applied in the particular switching order shown (e.g., decreasing gate voltage and increasing source/drain voltage) to maximize drain-source current flow during AC operation of the device. This pattern can encourage heat generation within a MOS transistor itself, thus encouraging transformation of latent, thermally activated defects to gross defects. In other words, a high current (accomplished using the voltage pattern in Region B) is passed through the device to increase local resistive heating (power dissipation). This local heating can accelerate the transformation of, for example, latent defects such as partially open conductors (e.g., interconnections) into fully open, and detectable, gross defects.

Region C of FIG. 2A illustrates another voltage condition capable of transforming another type of latent defect into a detectable gross defect. A high drain voltage and a low gate voltage causes a relatively high reverse bias condition (e.g., again, within +/−10%, +/−20% of a device voltage rating). In some examples, this can generate high leakage current through the gate region of the transistor. High leakage current can, in turn, induce a breakdown mechanism known as time-dependent junction degradation (TDJD), which stresses interfaces between source/drain regions and the semiconductor body (comprising a channel region) between the source and drain regions. Stressing these interfaces in turn can increase reverse leakage current, causing areas in the source/drain regions implanted with dopants and that may be defective to degrade and electrically short.

Thus, as shown in the example illustrated in FIG. 2A, multiple defect mechanisms can be effectively stimulated so as to accelerate latent defects that cannot normally be detected by standard manufacturing test patterns or transformed into gross defects using burn-in.

Figure 2B:
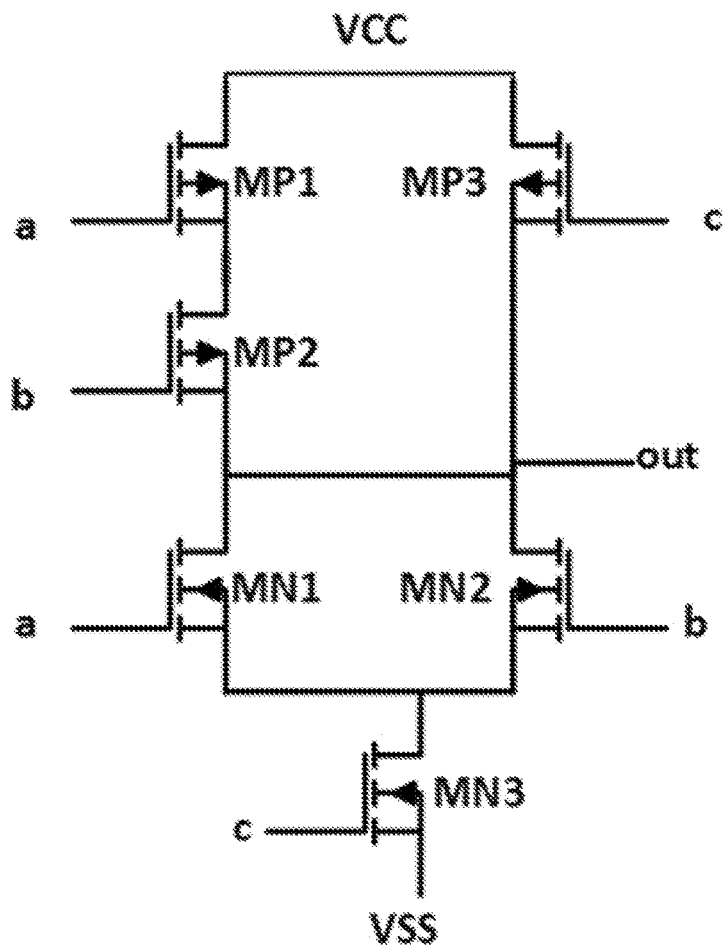
FIG. 2B is a circuit diagram of a device that includes six transistors, and for which an input pattern such as the one in FIG. 2A is determined to provide a stress to one or more of the transistors of the device, in accordance with an embodiment of the present disclosure.

FIG. 2B illustrates an example circuit that is presented to illustrate a technique by which stress input patterns can be determined so that a specific device within a cell can be intentionally selected so as to then receive the accelerating stress illustrated in FIG. 2A. That is, an input pattern can be determined to stress a desired semiconductor device within an integrated circuit, and thus transform some or all types of latent defects in the desired transistor into gross defects within specific semiconductor devices and/or interconnections within a cell intentionally and systematically.

The device in FIG. 2B shows an example of a 3-input combinational gate with six transistors. There are $2^3=8$ possible digital input combinations for this device where the 3-bit input abc can be 000, 001, 010, 011, 100, 101, 110 and 111. The logic level 0 represents zero voltage whereas the logic level 1 represents a standard logic high value (e.g., based on VDD or VCC).

For purposes of illustration, it is assumed that the transistor MN3 is desired to be stressed. As described below, an input pattern for transistor MN3 is determined so as to cause internal heating, as described above in the context of Region B of FIG. 2A. To cause a self-heating effect sufficient to accelerate latent defects in transistor MN3, an input stimulus among the 8 digital input combinations choices can be identified that causes maximum drain-source current during a switching transition. Assuming a rail or maximum voltage of 0.65 V, circuit simulations with the 8 different input stimuli generate a peak drain current ($I_d$) through MN3 as $I_d(000)=0.21$ μA, $I_d(001)=0.59$ μA, $I_d(010)=6.06$ μA, $I_d(011)=57.8$ μA, $I_d(100)=1.06$ μA, $I_d(101)=64.2$ μA, $I_d(110)=1.69$ μA, $I_d(111)=1.34$ mA. Based on these simulation results, the maximum drain current through MN3 is induced by the input stimuli "abc"=111 out of the 8 input stimuli choices. Hence, the input stimuli 111 is chosen to maximize Region B defect acceleration for MN3. This methodology can be followed to find appropriate input stimulus to induce acceleration of latent defects in some or all of the three regions identified above and for other transistors in a cell being analyzed.

Other stress patterns for reliably accelerating latent defects will be appreciated in light of this disclosure, and can vary depending on the structure being stressed. For instance, an example stress pattern for a diode includes applying high reverse voltage across the diode terminals for exciting maximal strain across diode insulator. An example stress pattern for a resistor includes applying a maximum voltage across the terminals of the resistor which in turn induces maximum current flow through the resistor which will in turn induce the highest thermal effects. An example stress pattern for a capacitor includes applying a maximum voltage across the capacitor terminals which in turn induces the maximum instantaneous current flow, thus stressing the capacitor dielectric. An example stress pattern for an inductor includes applying a highest current switching across the inductor terminals which in turn induces the maximum change in magnetic flux, thus generating high electrical voltage across the inductor terminals. An example stress pattern for an interconnect feature includes applying a highest current flow through an interconnect which in turn increases the probability of electro-migration and/or opening of excessively thin conductors (such as conductors including an unintentional partial opening or void).

In the case of an interconnect or other component to be stressed, note that the interconnect or component can be characterized by the driving circuit components (at the input of the interconnect or component) and the driven circuit components (at the output of the interconnect or component). In this manner, appropriate stimuli conditions can be generated at the driving circuit component output and the driven circuit component input that maximize the current flow through the interconnect. Each of these example stress patterns can be applied under specified operating voltages and temperature and manifested at the appropriate nodes using standard circuit analysis and delivery methods, as will be appreciated. With respect to interconnect structures (e.g., vias, conductive lines, wires, etc), high current flow (e.g., between a driving component on one side of the interconnection and a driven component on an opposing side of the interconnection) or, alternatively, a high current density per unit of cross-sectional area of the interconnection, increases probability of electromigration of interconnection material, which can in turn cause a void to form in the interconnection. These voids, when sufficiently large, can form an open circuit. The technique described above can be adapted for interconnections of interest so as to identify an input pattern and a rail or maximum voltage that direct a current through the interconnections of interest that is sufficient to accelerate any partial opens in the stressed interconnections.

It will be appreciated that any number of component defects can be accelerated in analogous ways, namely the application of stress conditions that can cause a transformation of a latent form of a particular defect to a detectable, gross defect. Other defect types provided for illustration include, but are not limited to: maximizing a collector current flow between and/or maximizing a voltage difference between one or more of (1) a collector and a corresponding emitter and/or (2) a base and a corresponding emitter in a bipolar junction transistor (BJT).

Accelerating Defects Across Different Device Types in an Integrated Circuit

The preceding description highlights the different electrical and thermal conditions needed to transform latent defects for different types of structures in integrated circuits (also sometimes referred to collectively as "elementary circuit components") into gross defects that can be detected while a semiconductor device is still in manufacturing. An elementary circuit component can be, for instance, an active or passive component such as a transistor, a diode, a capacitor, a resistor, an inductor, or a conductor (e.g., a via or narrow conductive line or interconnect feature). Because integrated circuits may include thousands, tens of thousands, or millions of each of the preceding types of individual devices, a systematic method for generating stress conditions, and quantifying the effectiveness of those stress conditions for the integrated circuit as a whole (in other words "grading" the stress conditions) for an integrated circuit having many different types of devices would be useful. One example of such a method is illustrated in FIGS. 3A-B.

The example method 300, described below, can be used to generate stress stimuli for an integrated circuit, which can then be graded (using e.g., simulation modeling techniques, such as Monte Carlo based circuit performance simulators) to quantify its effectiveness. The method 300 can be applied recursively along with grading criteria to determine the optimal stress conditions in light of other factors such as limitations on times available for stress equipment.

Figure 3A:
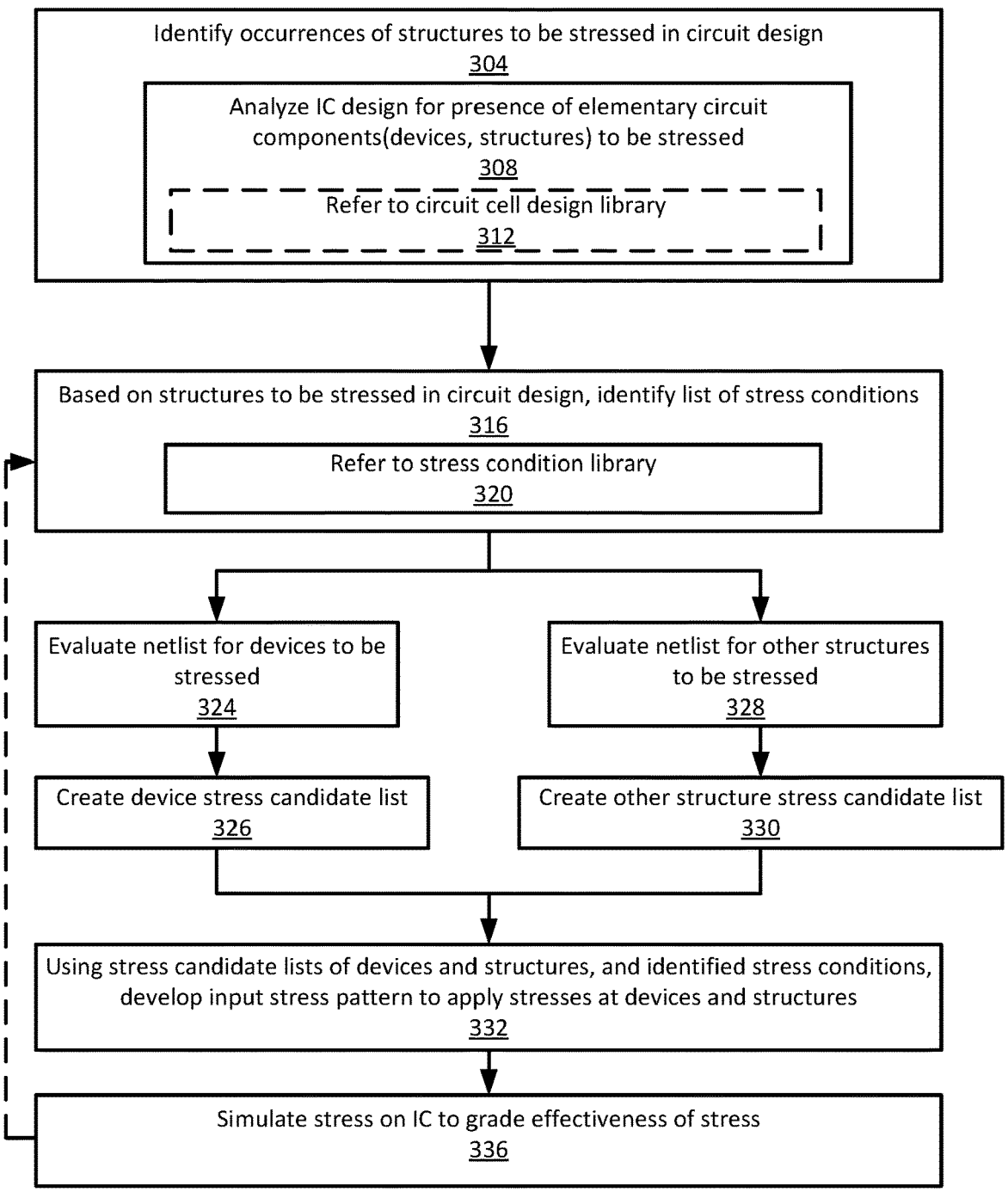
FIGS. 3A-B collectively illustrate an example method for identifying structures within an integrated circuit design that are more likely to include one or more types of latent defects, formulating stress conditions that can transform the latent defects into gross defects, and evaluating a simulated effectiveness of the stress, in some embodiments of the present disclosure.
Figure 3B:
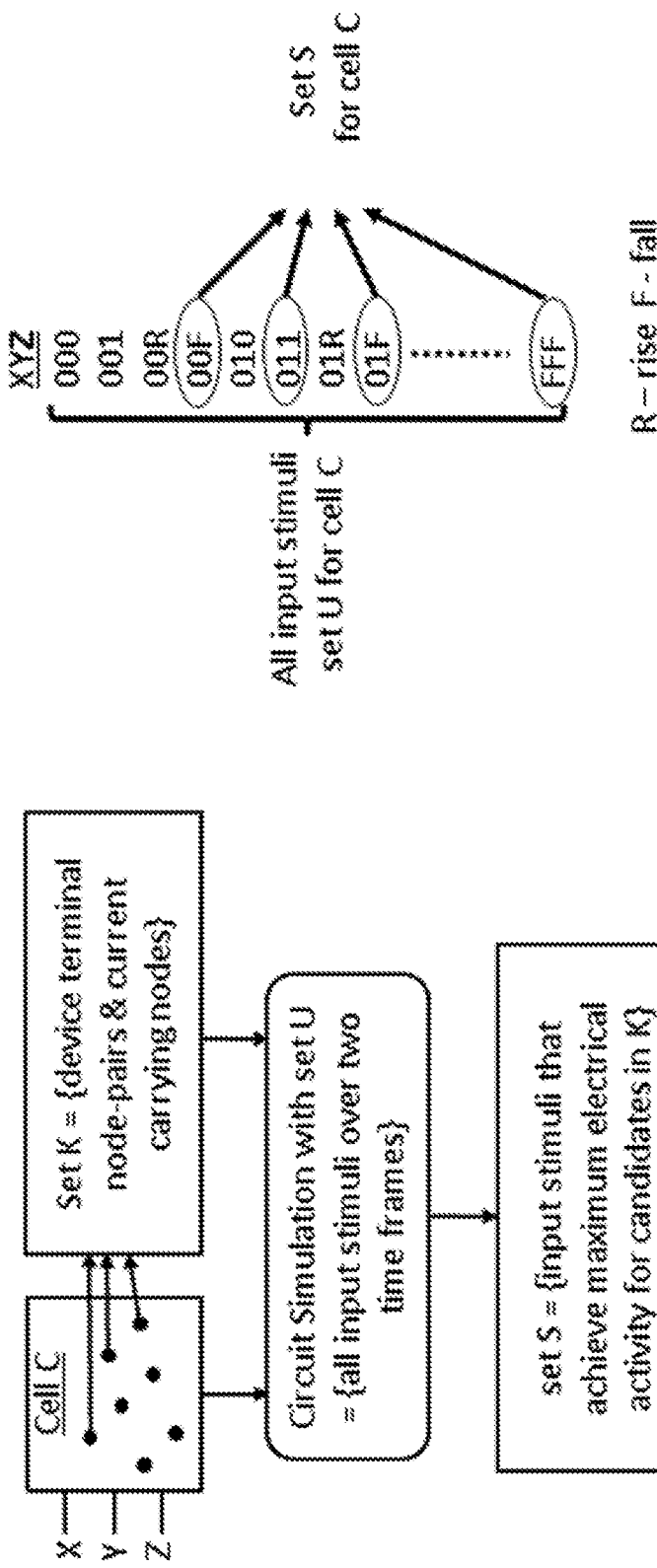

With reference now to FIG. 3A, the example method 300 begins by identifying 304 occurrences of elementary circuit components in an integrated circuit that may include latent defects to be transformed to gross defects. As indicated above, these elementary circuit components can include various semiconductor devices (e.g., transistors, resistors, capacitors, diodes, inductors) as well as other structures that include conductive structures or lines and other interconnections such as vias, proximately placed conductive lines (e.g., within +/−5% or +/−10% of a minimum spacer per design ground rules) and local interconnects. In some examples, the identifying 304 can occur by analyzing 308 a circuit design for the presence of structures to be stressed. In one example, the circuit design can be analyzed 308 by referring 312 to a "library" (that is, a digitally encoded collection) of integrated circuit cells (or "standard cells"). A standard cell includes a number of interconnected individual structures arranged in a certain configuration that performs a desired function (e.g., adding, subtracting, multiplying, filtering, amplifying, etc). In any such cases, a standard cell can be used as a unit when designing larger scale integrations of integrated circuits. These cells, which may occur frequently within any given design, can be analyzed to conveniently, efficiently, and systematically identify occurrences of structures to be stressed. The occurrence of the cells that include a given arrangement of structures to be stressed may then be identified in any given integrated circuit design. This two-step technique may be more computationally efficient than examining an integrated circuit design directly for individual structures to be stressed. This standard cell characterization is achieved through structural analysis, circuit simulation or other methodologies to generate a set of input stimuli for each library cell that satisfies the stress grading criteria. As will be explained in turn, the set of input stimuli generated in the library cell characterization process can be used to create a stress candidate list for cell instances, according to some embodiments.

Once the types of structures (e.g., passive and/or active devices) to be stressed are identified within a design, corresponding stress conditions can be identified 316 that that can transform latent defects to gross defects, as described above. For example, an occurrence of a capacitor will cause stresses intended to accelerate dielectric breakdown to be identified 316. An occurrence of proximate conductive structures in the design will cause identification 316 stresses intended to promote electromigration. Other example stress conditions corresponding to various elementary circuit components and latent defect types have been described above. Still other example latent defect types and corresponding stress conditions will be appreciated in light of the present disclosure.

Identification 316 of the stress conditions can be facilitated, in one example, by referring 320 to a stress condition library. The stress condition library can store the various stress conditions (e.g., temperatures, voltage, current, combinations thereof) to be applied to the combinations of voltage/current ratings, dimensions, compositions, types, and configurations of various elementary circuit components, examples of which have been described above. Storing the stress conditions for each type of elementary circuit component can facilitate the convenient identification 316 of stress conditions applicable to a given circuit design.

In one embodiment, locations of various elementary circuit components within a circuit design are identified by evaluating a netlist of the design. As will be appreciated a netlist identifies the connectivity between elementary circuit components and/or standard cells within an integrated circuit design. That is, in some examples a netlist can identify the elementary circuit components themselves and the electrical paths by which elementary circuit components are connected to one another. In some examples, the netlist can be encoded in a hardware description language that can be readily analyzed using circuit simulators. The benefit of compatibility with a simulator will be appreciated in light of some examples described herein.

Regardless of the form or encoding scheme, an integrated circuit netlist can be evaluated to identify 324 locations and/or connective pathways of elementary circuit components (e.g., transistors, resistors, inductors, capacitors, diodes) and evaluated 328 to identify locations and/or connective pathways of other structures (e.g., vias, conductive lines, interconnects). In one embodiment, a netlist for a design is evaluated 324 to determine locations of semiconductor components to be stressed, including the connections of an identified device and any corresponding connections that would influence the current and/or voltage experienced by the device relative to the current and/or voltage applied to an input pad. Similarly, the netlist is evaluated 328 for locations of other structures (e.g., interconnections) to be stressed, as well as any corresponding connections that would influence the current and/or voltage experienced by the structure relative to the current and/or voltage applied to an input pad.

Respective stress candidate lists 326, 330 are then created based on the preceding evaluations 324, 328. These stress candidate lists can be thought of as truncated netlists that identify the type, locations, and connectivity of elementary circuit components to be stressed. Furthermore, the stress candidate lists 326, 330, can represent the conditions (e.g., voltage, current, rate of change of voltage and/or current) that can be satisfied at each elementary circuit component to be stressed so as to convert latent defects into gross defects throughout the integrated circuit. In some examples, one or more of the stress candidate lists 326, 330 is split into two companion stress candidate lists: one identifying the elementary circuit components to be stressed and one identifying any interconnection, diodes and passive devices (e.g., inductors, capacitors, resistors). These two stress candidate lists can then be used to represent conditions needed at each elementary circuit component to cause an accelerating stress in the entire integrated circuit.

So, for instance, in one example embodiment, given a circuit netlist with cell instances, diodes (and transistors), passive devices, and interconnects, two stress candidate lists are created to represent the conditions that need to be satisfied at each instance of each component to maximize electrical stress through the entire circuit, with the goal of converting latent defects into gross defects. One stress candidate list is for cell instances and the other stress candidate list is for interconnects, diodes and passive devices. The input stimuli generated in the library cell characterization process described above are used to create the stress candidate list for cell instances (330). For the interconnects, diodes and passive devices, the stress conditions for stressing individual components as previously described are used to create a separate stress candidate list (326). These two stress candidate lists represent the conditions needed at each netlist component that induces the maximum or otherwise sufficient stress in the entire circuit and are subsequently used at 332 to generate the requisite input stimuli for exciting latent defects in the given circuit.

As noted above, accelerating stress input patterns 332 can then be developed using the stress candidate lists and the identified stress conditions corresponding to the elementary stress components identified. Furthermore, stress input patterns 332 can be developed by using the stress candidate lists 326, 330 (whether each one is in a single list format or a multiple list format) in using a stress pattern generation algorithm.

In both of these situations, identification of structural factors (e.g., composition, current/voltage ratings, configuration), locations and connectivity of the elementary circuit components to be stressed can be used in the development 332 of stress conditions that transform latent defects into gross defects that can be detected prior to installation and use in an end-user device.

Effectiveness of the developed 332 input stress pattern can be modeled or "graded" 336 for its effectiveness. That is, integrated circuit simulators that use the netlist and can simulate the operation of an integrated circuit based on the input stress patterns can be used to evaluate the currents, voltages, and temperatures experienced at individual elementary circuit components within the integrated circuit. The simulation results can then be analyzed and/or filtered to determine whether stress conditions at elementary circuit components of interest are actually accomplished by the input stress patterns. In situations in which this "grading" 336 indicates insufficient level of stressing at elementary circuit components, some or all of the elements of the method 300 can be recursively performed to improve the effectiveness of the stress input pattern. This is indicated in FIG. 3A by dashed arrow connecting the grading 336 to the identification 316 of stress conditions.

FIG. 3B depicts an embodiment of the methodology shown in FIG. 3A in a graphical use-case fashion. As can be seen, a standard cell C is provided that includes a number of elementary circuit components. The components may include active components, passive components and/or other testable structures within a given integrated circuit cell. A set K of structures to be tested is identified, which in this example case includes device terminal node-pairs and current carrying nodes. As will be appreciated, a node-pair can be used to define the location of passive and active components. For instance, the nodes corresponding the first and second terminals of a resistor or capacitor form a first node pair, and the nodes corresponding to the gate and drain of a transistor form a second node pair, etc. Developing set K effectively corresponds to 304, 308, and 312 of FIG. 3A, and that previous relevant discussion is equally applicable here. Then, circuit simulation is used to identify a set U of all input stimuli needed to test the cell itself as well as the individual elementary circuit components therein. This corresponds to 316, 320, 324, 326, 328, and 330 of FIG. 3A, and that previous relevant discussion is equally applicable here. With set U in hand, set S is then identified. As can be further seen, set S includes the input stimuli that will achieve maximum electric activity for the candidates in set K. Note that set S can be a subset of set U, for a given cell C. Each of the test conditions (input stimulus) is this example case are in the form of three inputs: X, Y, and Z. The values of three inputs are defined for each stimulus input, and are one of logical 0, logical 1, rising (transitioning from 0 to 1), or falling (transitioning from 1 to 0). This corresponds to 332 and 336 of FIG. 3A, and that previous relevant discussion is equally applicable here.

Figure 4:
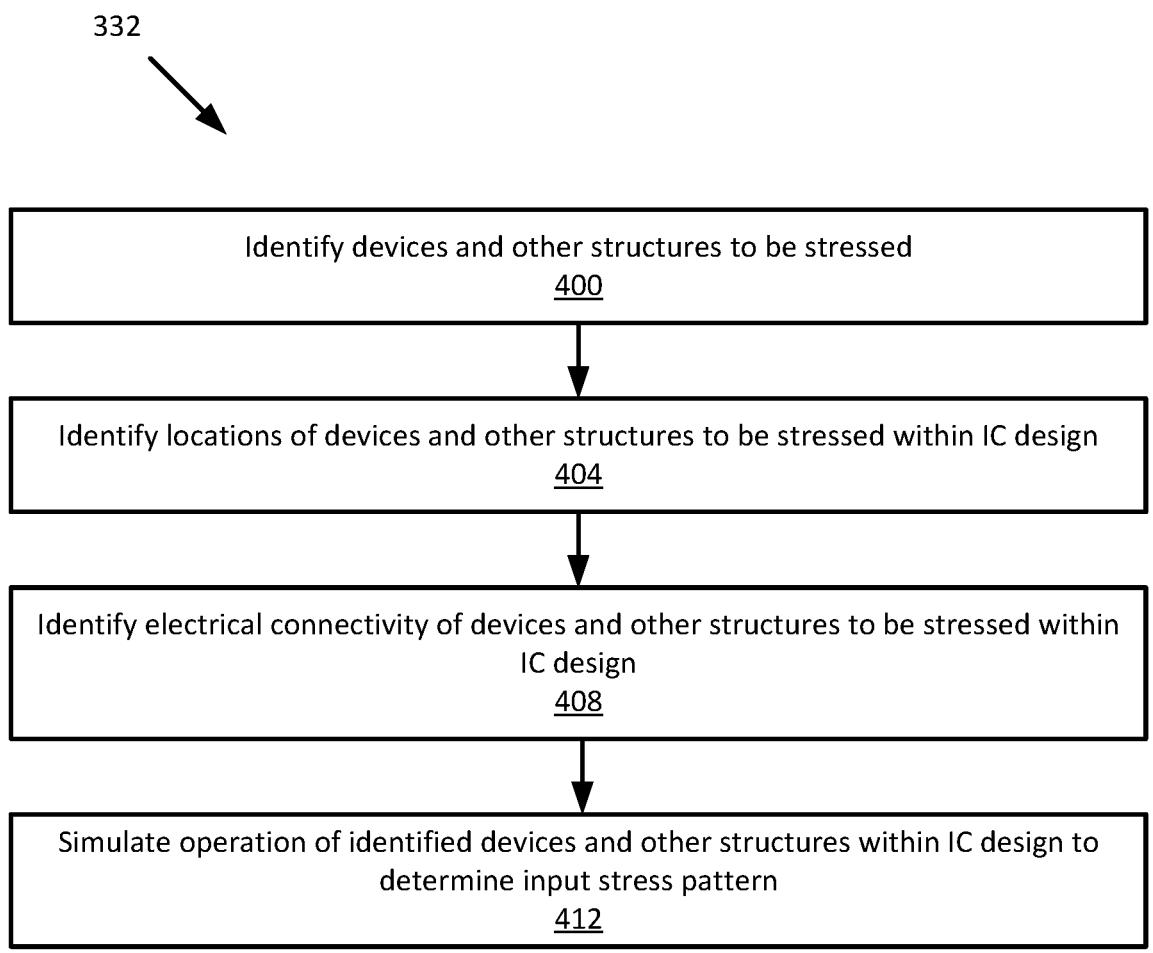
FIG. 4 is a method flow diagram illustrating an example method for developing an input stress pattern for use in the method of FIGS. 3A-B, in accordance with some embodiments of the present disclosure.

FIG. 4 illustrates a portion of the method 300 in more detail. Specifically, an example method for the execution of element 332 of the method 300 is shown in FIG. 4. To develop 332 input stress patterns for elementary circuit components using stress candidate lists (described above in the context of FIGS. 3A-B), elementary circuit components (e.g., devices such as transistors, inductors, capacitors, resistors; and structures such as interconnections) are identified 400, as described above. Using the stress candidate lists and/or netlist of the integrated circuit design, locations within the integrated circuit design of these elementary circuit components to be stressed are systematically identified 404. Using one or more of the stress candidate lists and/or netlist, the electrical connectivity of the elementary circuit components are identified 408.

Once the electrical connectivity is identified 408, operation of the integrated circuit at the elementary circuit component to be stressed can be simulated 412. This simulation can be useful in part to determine the effect of intervening circuit components on the behavior of an elementary circuit component to be stressed so that a stress pattern can be properly formulated to actually stress the elementary circuit component. For example, if an elementary circuit component to be stressed is connected to an input/output contact with voltage regulators, resistors, and inductors disposed between, a stress input pattern will need to be designed that accounts for these intervening elements so that the elementary circuit component actually experiences the stress voltages and/or currents. Once simulated (e.g., using techniques analogous to the example described above in FIG. 2B), a stress pattern can be revised as needed.

System Architecture

Figure 5:
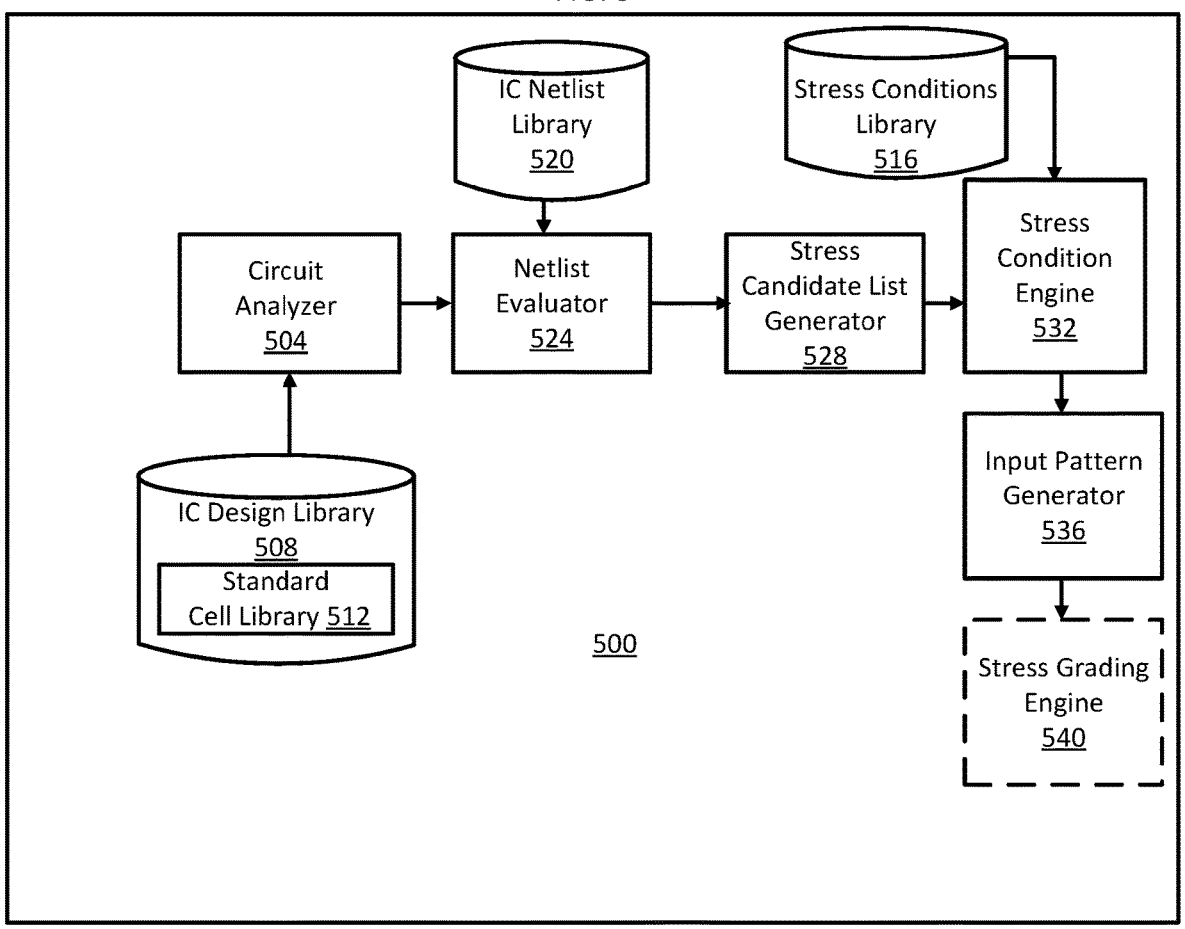
FIG. 5 is an example system diagram of a system for identifying structures to be stressed and for formulating stress conditions that can transform latent defects into gross defects, in some embodiments of the present disclosure.

FIG. 5 is a block diagram illustrates an example system 500 for executing an embodiment of the example method 300. The example system 500 includes, in this embodiment, a circuit analyzer 504, an integrated circuit design library 508, a stress conditions library 516, an integrated circuit netlist library 520, a netlist evaluator 524, a stress candidate list generator 528, a stress condition engine 532, an input pattern generator 536. An optional stress grading engine 540 is included in the depiction of this embodiment.

As illustrated in FIG. 5, the circuit analyzer 504 can retrieve a stored version of an integrated circuit (IC) design from the integrated circuit design library 508. As mentioned above, the circuit analyzer 504 can identify elementary circuit components (whether active devices (e.g., transistors), passive devices (e.g., resistors, inductors, capacitors), or other testable structures (e.g., interconnections) to be stressed in a two-step process by first identifying the occurrence of elementary circuit components of interest in standard cells (stored in the standard cell library 512 within library 508) and then identifying the occurrence of the cells within the broader integrated circuit design.

Upon the circuit analyzer 504 identifying the presence of elementary circuit components to be stressed, the identification of these structures is passed to the netlist evaluator 524. The netlist evaluator 524 identifies locations and connectivity (including any intervening passive structures) using the integrated circuit netlist stored in the integrated circuit netlist library 520. The locations within the design and the connectivities of the devices to be stressed are then concisely prepared by the stress candidate list generator 528, as described above. Stresses corresponding to these structures are selected by the stress conditions library 516 from the stress condition engine 532 and transformed into a stress input pattern by the input pattern generator 536, which are stored therein. The effect of the stress on the various identified elementary circuit components can be evaluated by the stress grading engine 540, which can initiate a recursive analysis to produce stress conditions that improve the effectiveness of the applied stresses.

It will be appreciated that any of the forgoing engines and libraries can be instantiated in a computing device (described below) or a computing system such as a workstation, desktop computer, server, laptop, handheld computer, tablet computer (e.g., the iPad™ tablet computer), mobile computing or communication device (e.g., the iPhone™ mobile communication device, the Android™ mobile communication device, and the like), or other form of computing or telecommunications device that is capable of communication and that has sufficient processor power and memory capacity to perform the operations described in this disclosure. The system 500 can include one or more storage devices and/or non-transitory computer-readable media (e.g., libraries 508, 516, 520) having encoded thereon computer-executable instructions or software for implementing techniques as variously described in this disclosure. The storage devices may include a computer system memory or random access memory, such as a durable disk storage (which may include any suitable optical or magnetic durable storage device, e.g., RAM, ROM, Flash, USB drive, or other semiconductor-based storage medium), a hard-drive, CD-ROM, or other physical computer readable media, for storing data and computer-readable instructions and/or software that implement various embodiments as taught in this disclosure. The storage device may include other types of memory as well, or combinations thereof. The storage device may be provided on the computing device or provided separately or remotely from the computing device. The non-transitory computer-readable media may include, but are not limited to, one or more types of hardware memory, non-transitory tangible media (for example, one or more magnetic storage disks, one or more optical disks, one or more USB flash drives), and the like. The non-transitory computer-readable media included in the computing device may store computer-readable and computer-executable instructions or software for implementing various embodiments. The computer-readable media may be provided on the computing device 1000 or provided separately or remotely from the computing device.

The system 500 also includes at least one processor for executing computer-readable and computer-executable instructions or software stored in the storage device and/or non-transitory computer-readable media and other programs for controlling system hardware. Virtualization may be employed in the computing device so that infrastructure and resources in the computing device may be shared dynamically. For example, a virtual machine may be provided to handle a process running on multiple processors so that the process appears to be using only one computing resource rather than multiple computing resources. Multiple virtual machines may also be used with one processor. In other embodiments, the functional components/modules may be implemented with hardware, such as gate level logic (e.g., FPGA) or a purpose-built semiconductor (e.g., ASIC). Still other embodiments may be implemented with a microcontroller having a number of input/output ports for receiving and outputting data, and a number of embedded routines for carrying out the functionality described in this disclosure. In a more general sense, any suitable combination of hardware, software, and firmware can be used, as will be apparent.

As will be appreciated in light of this disclosure, the various modules and components of the system shown in FIG. 5 can be implemented in software, such as a set of instructions (e.g., HTML, XML, C, C++, object-oriented C, JavaScript, Java, BASIC, etc.) encoded on any computer readable medium or computer program product (e.g., hard drive, server, disc, or other suitable non-transient memory or set of memories), that when executed by one or more processors, cause the various methodologies provided in this disclosure to be carried out. It will be appreciated that, in some embodiments, various functions performed by the user computing system, as described in this disclosure, can be performed by similar processors and/or databases in different configurations and arrangements, and that the depicted embodiments are not intended to be limiting.

Infringement of any of the foregoing can be detected by observation of significant decreases in burn-in or changes to burn-in techniques so as to include elements other than temperature and voltage toggling based acceleration techniques. Furthermore, infringement can be detected by manufacturing test stimuli being used for purposes other than defect detection, fault coverage, functional operation and performance benchmarking or a significant decrease in manufacturing test time for burn-in.

Further Example Embodiments

The following examples pertain to further embodiments, from which numerous permutations and configurations will be apparent.

Example 1 is a method for transforming latent defects to gross defects in an integrated circuit structure, the method comprising: identifying in an integrated circuit design occurrences of one or more elementary circuit components to be stressed; identifying one or more stress conditions to stress the at least one identified elementary circuit component; using a netlist, identifying locations of the at least one identified elementary circuit component in the integrated circuit design; adapting the identified one or more stress conditions to include the identified locations of the at least one identified elementary circuit component; and applying the one or more stress conditions to stress the at least one identified elementary circuit component.

Example 2 includes the subject matter of Example 1, wherein identifying locations of the at least one elementary circuit component includes creating a stress candidate list of the at least one identified elementary circuit component, the stress candidate list including electrical connections to the at least one identified elementary circuit component to be stressed.

Example 3 includes the subject matter of Example 1 or 2, wherein adapting the identified one or more stress conditions includes using the stress candidate list and the electrical connections to the at least one identified elementary circuit component to identify the one or more stress conditions at the at least one identified elementary circuit component.

Example 4 includes the subject matter of any of the preceding Examples, wherein identifying occurrences of elementary circuit components to be stressed comprises: analyzing a plurality of standard cells to identify a subset of standard cells that include the one or more elementary circuit components to be stressed; and analyzing the integrated circuit design for occurrences of the subset of standard cells.

Example 5 includes the subject matter of any of the preceding Examples, wherein the one or more elementary circuit components comprise a transistor and/or a diode.

Example 6 includes the subject matter of any of the preceding Examples, wherein the one or more elementary circuit components comprise an inductor, a resistor, and/or a capacitor.

Example 7 includes the subject matter of any of the preceding Examples, wherein the one or more elementary circuit components comprise one or more interconnect structures, the interconnect structures including a line or via.

Example 8 includes the subject matter of any of the preceding Examples, wherein at least one of the identified elementary circuit components to be stressed is within a standard cell of the integrated circuit design.

Example 9 includes the subject matter of any of the preceding Examples, wherein applying the one or more stress conditions comprises: applying a first voltage to one or more of a source region and a drain region, and applying a second voltage at a gate region, the first voltage less than the second voltage; transitioning the first voltage applied to one or more of the source region and the drain region to a third voltage greater than the first voltage and transitioning the second voltage applied to the gate region to a fourth voltage less than the second voltage, the third voltage greater than the fourth voltage; and applying a fifth voltage to one or more of the source region and the drain region, and applying a sixth voltage at the gate region, the fifth voltage greater than the sixth voltage.

Example 10 includes the subject matter of Example 9, wherein: a combination of the first voltage and the second voltage stresses defects in a gate dielectric layer; the transition to the third voltage and the fourth voltage causes resistive heating to stress thermally activated defects; and a combination of the fifth voltage and the sixth voltage stresses interfacial defects between the source region and the gate region, and between the drain region and the gate region.

Example 11 includes the subject matter of any of the preceding Examples, wherein applying the one or more stress conditions to stress the at least one identified elementary circuit component includes applying a reverse voltage across terminals of a diode.

Example 12 includes the subject matter of any of the preceding Examples, wherein applying the one or more stress conditions to stress the at least one identified elementary circuit component includes applying a maximum voltage across terminals of a resistor.

Example 13 includes the subject matter of any of the preceding Examples, wherein applying the one or more stress conditions to stress the at least one identified elementary circuit component includes applying a maximum voltage across terminals of a capacitor.

Example 14 includes the subject matter of any of the preceding Examples, wherein applying the one or more stress conditions to stress the at least one identified elementary circuit component including passing a maximum current through an inductor.

Example 15 includes the subject matter of any of the preceding Examples, wherein applying the one or more stress conditions to stress the at least one identified elementary circuit component includes passing a maximum current through an interconnect feature.

Example 16 includes the subject matter of any of the preceding Examples, wherein applying the one or more stress conditions to stress the at least one identified elementary circuit component includes passing a maximum current through from a source to a drain of a transistor.

Example 17 includes the subject matter of any of the preceding Examples, further comprising grading an effectiveness of the stress conditions by simulating acceleration of defects at the at least one identified elementary circuit component upon application of simulated stress conditions.

Example 18 is a computer program product including one or more non-transitory machine-readable mediums that include instructions that when executed by one or more processors cause a process to be carried out for transforming latent defects to gross defects in an integrated circuit structure, the process comprising: identifying in an integrated circuit design occurrences of one or more elementary circuit components to be stressed; identifying one or more stress conditions to stress the at least one identified elementary circuit component; using a netlist, identifying locations of the at least one identified elementary circuit component in the integrated circuit design; adapting the identified one or more stress conditions to include the identified locations of the at least one identified elementary circuit component; and storing the one or more stress conditions for subsequent use to stress the at least one identified elementary circuit component.

Example 19 includes the subject matter of Example 18, further comprising applying the one or more stress conditions to stress the at least one identified elementary circuit component.

Example 20 includes the subject matter of either of Examples in 18 or 19, wherein identifying locations of the at least one elementary circuit component includes creating a stress candidate list of the at least one identified elementary circuit component, the stress candidate list including electrical connections to the at least one identified elementary circuit component to be stressed.

Example 21 includes the subject matter of any of Examples 18-20, wherein adapting the identified one or more stress conditions includes using the stress candidate list and the electrical connections to the at least one identified elementary circuit component to identify the one or more stress conditions at the at least one identified elementary circuit component.

Example 22 includes the subject matter of any of Examples 18-21, wherein identifying occurrences of elementary circuit components to be stressed comprises: analyzing a plurality of standard cells to identify a subset of standard cells that include the one or more elementary circuit components to be stressed; and analyzing the integrated circuit design for occurrences of the subset of standard cells.

Example 23 includes the subject matter of any of Examples 18-22, wherein the one or more elementary circuit components comprise a transistor and/or a diode.

Example 24 includes the subject matter of any of Examples 18-23, wherein one or more elementary circuit components comprise an inductor, a resistor, and/or a capacitor.

Example 25 includes the subject matter of any of Examples 18-24, wherein the one or more elementary circuit components comprise one or more interconnect structures, the interconnect structures including a line or via.

Example 26 includes the subject matter of any of Examples 18-25, wherein at least one of the identified elementary circuit components to be stressed is within a standard cell of the integrated circuit design.

Example 27 includes the subject matter of any of Examples 18-26, wherein applying the one or more stress conditions comprises: applying a first voltage to one or more of a source region and a drain region, and applying a second voltage at a gate region, the first voltage less than the second voltage; transitioning the first voltage applied to one or more of the source region and the drain region to a third voltage greater than the first voltage and transitioning the second voltage applied to the gate region to a fourth voltage less than the second voltage, the third voltage greater than the fourth voltage; and applying a fifth voltage to one or more of the source region and the drain region, and applying a sixth voltage at the gate region, the fifth voltage greater than the sixth voltage.

Example 28 includes the subject matter of Example 27, wherein: a combination of the first voltage and the second voltage stresses defects in a gate dielectric layer; the transition to the third voltage and the fourth voltage causes resistive heating to stress thermally activated defects; and a combination of the fifth voltage and the sixth voltage stresses interfacial defects between the source region and the gate region, and between the drain region and the gate region.

Example 29 includes the subject matter of any of Examples 18-28, wherein the one or more stress conditions include a reverse voltage to be applied across terminals of a diode.

Example 30 includes the subject matter of any of Examples 18-29, wherein the one or more stress conditions include a maximum voltage to be applied across terminals of a resistor.

Example 31 includes the subject matter of any of Examples 18-30, wherein the one or more stress conditions include a maximum voltage to be applied across terminals of a capacitor.

Example 32 includes the subject matter of any of Examples 18-31, wherein the one or more stress conditions include a maximum current to be passed through an inductor.

Example 33 includes the subject matter of any of Examples 18-32, wherein the one or more stress conditions include a maximum current to be passed through an interconnect feature.

Example 34 includes the subject matter of any of Examples 18-33, wherein applying the one or more stress conditions to stress the at least one identified elementary circuit component includes passing a maximum current through from a source to a drain of a transistor.

Example 35 is a system for transforming latent defects to gross defects in an integrated circuit structure, the system comprising: an integrated circuit design library configured for storing an integrated circuit design that includes one or more elementary circuit components; an integrated circuit design netlist library configured for storing a netlist of the integrated circuit design, the netlist identifying locations of the one or more elementary circuit components; a stress conditions library configured for storing electrical and thermal stress conditions for accelerating latent defects; a circuit analyzer for identifying in an integrated circuit design occurrences of one or more elementary circuit components to be stressed; a stress condition engine configured for identifying one or more stress conditions to stress the at least one identified elementary circuit component; a netlist evaluator configured for, using the netlist, identifying locations of the at least one identified elementary circuit component in the integrated circuit design; and an input pattern generator configured for adapting the identified one or more stress conditions to include the identified locations of the at least one identified elementary circuit component.

Example 36 includes the subject matter of Example 35, wherein at least one of the identified elementary circuit components to be stressed is within a standard cell of the integrated circuit design.

Example 37 includes the subject matter of either of Examples 35 or 36, wherein the input pattern generator is further configured for storing the one or more stress conditions for subsequent use to stress the at least one identified elementary circuit component.

Example 38 includes the subject matter of any of Examples 35-37, wherein the integrated circuit design library further includes a standard cell library configured for storing standard cells of the integrated circuit design.

Example 39 includes the subject matter of any of Examples 35-38, further comprising a stress candidate list generator configured for storing elementary circuit components to be stressed and corresponding electrical connectivities in the integrated circuit design.

Example 40 includes the subject matter of any of Examples 35-39, wherein the stress condition engine is further configured for adapting the identified one or more stress conditions includes using the stress candidate list and the electrical connections to the at least one identified elementary circuit component to identify the one or more stress conditions at the at least one identified elementary circuit component.

Example 41 includes the subject matter of any of Examples 35-40, further comprising a stress grading engine for simulating an effectiveness of an identified stress for accelerating a latent defect of the at least one identified elementary circuit component.

What is claimed is:

1. A method for transforming latent defects to gross defects in an integrated circuit structure, the method comprising:
    identifying in an integrated circuit design occurrences of one or more elementary circuit components to be stressed;
    identifying one or more stress conditions to stress the at least one identified elementary circuit component;
    using a netlist, identifying locations of the at least one identified elementary circuit component in the integrated circuit design; adapting the identified one or more stress conditions to include the identified locations of the at least one identified elementary circuit component; and
    applying the one or more stress conditions to stress the at least one identified elementary circuit component, wherein applying the one or more stress conditions comprises:
    applying a first voltage to one or more of a source region and a drain region, and applying a second voltage at a gate region, the first voltage less than the second voltage;
    transitioning the first voltage applied to one or more of the source region and the drain region to a third voltage greater than the first voltage and transitioning the second voltage applied to the gate region to a fourth voltage less than the second voltage, the third voltage greater than the fourth voltage; and
    applying a fifth voltage to one or more of the source region and the drain region, and applying a sixth voltage at the gate region, the fifth voltage greater than the sixth voltage.

2. The method of claim 1, wherein identifying locations of the at least one elementary circuit component includes creating a stress candidate list of the at least one identified elementary circuit component, the stress candidate list including electrical connections to the at least one identified elementary circuit component to be stressed.

3. The method of claim 2, wherein adapting the identified one or more stress conditions includes using the stress candidate list and the electrical connections to the at least one identified elementary circuit component to identify the one or more stress conditions at the at least one identified elementary circuit component.

4. The method of claim 1, wherein identifying occurrences of elementary circuit components to be stressed comprises: analyzing a plurality of standard cells to identify a subset of standard cells that include the one or more elementary circuit components to be stressed; and analyzing the integrated circuit design for occurrences of the subset of standard cells.

5. The method of claim 1, wherein the one or more elementary circuit components comprise a transistor and/or a diode.

6. The method of claim 1, wherein the one or more elementary circuit components comprise an inductor, a resistor, and/or a capacitor.

7. The method of claim 1, wherein at least one of the identified elementary circuit components to be stressed is within a standard cell of the integrated circuit design.

8. The method of claim 1, wherein:
    a combination of the first voltage and the second voltage stresses defects in a gate dielectric layer;
    the transition to the third voltage and the fourth voltage causes resistive heating to stress thermally activated defects; and
    a combination of the fifth voltage and the sixth voltage stresses interfacial defects between the source region and the gate region, and between the drain region and the gate region.

9. The method of claim 1, wherein applying the one or more stress conditions to stress the at least one identified elementary circuit component includes applying a reverse voltage across terminals of a diode.

10. The method of claim 1, wherein applying the one or more stress conditions to stress the at least one identified elementary circuit component includes applying a maximum voltage across terminals of a resistor.

11. The method of claim 1, wherein applying the one or more stress conditions to stress the at least one identified elementary circuit component includes applying a maximum voltage across terminals of a capacitor.

12. The method of claim 1, wherein applying the one or more stress conditions to stress the at least one identified elementary circuit component including passing a maximum current through an inductor.

13. The method of claim 1, wherein applying the one or more stress conditions to stress the at least one identified elementary circuit component includes passing a maximum current through from a source to a drain of a transistor.

14. The method of claim 1, further comprising grading an effectiveness of the stress conditions by simulating acceleration of defects at the at least one identified elementary circuit component upon application of simulated stress conditions.

15. A computer program product including one or more non-transitory machine-readable mediums that include instructions that when executed by one or more processors cause a process to be carried out for transforming latent defects to gross defects in an integrated circuit structure, the process comprising:
identifying in an integrated circuit design occurrences of one or more elementary circuit components to be stressed;
identifying one or more stress conditions to stress the at least one identified elementary circuit component;
using a netlist, identifying locations of the at least one identified elementary circuit component in the integrated circuit design;
adapting the identified one or more stress conditions to include the identified locations of the at least one identified elementary circuit component;
storing the one or more stress conditions for subsequent use to stress the at least one identified elementary circuit component; and
applying the one or more stress conditions to stress the at least one identified elementary circuit component, wherein applying the one or more stress conditions comprises:
applying a first voltage to one or more of a source region and a drain region, and applying a second voltage at a gate region, the first voltage less than the second voltage;
transitioning the first voltage applied to one or more of the source region and the drain region to a third voltage greater than the first voltage and transitioning the second voltage applied to the gate region to a fourth voltage less than the second voltage, the third voltage greater than the fourth voltage; and
applying a fifth voltage to one or more of the source region and the drain region, and applying a sixth voltage at the gate region, the fifth voltage greater than the sixth voltage.

16. The computer program product of claim 15, wherein the one or more elementary circuit components comprise a transistor and/or a diode.

17. The computer program product of claim 15, wherein one or more elementary circuit components comprise an inductor, a resistor, and/or a capacitor.

18. The computer program product of claim 15, wherein:
a combination of the first voltage and the second voltage stresses defects in a gate dielectric layer;
the transition to the third voltage and the fourth voltage causes resistive heating to stress thermally activated defects; and
a combination of the fifth voltage and the sixth voltage stresses interfacial defects between the source region and the gate region, and between the drain region and the gate region.

19. A system for transforming latent defects to gross defects in an integrated circuit structure, the system comprising:
a processor;
a memory;
an integrated circuit design library configured for storing an integrated circuit design that includes one or more elementary circuit components;
an integrated circuit design netlist library configured for storing a netlist of the integrated circuit design, the netlist identifying locations of the one or more elementary circuit components;
a stress conditions library configured for storing electrical and thermal stress conditions for accelerating latent defects;
a circuit analyzer for identifying in an integrated circuit design occurrences of one or more elementary circuit components to be stressed, at least one of the identified elementary circuit components to be stressed within a standard cell of the integrated circuit design;
a stress condition engine configured for identifying one or more stress conditions to stress the at least one identified elementary circuit component; a netlist evaluator configured for, using the netlist, identifying locations of the at least one identified elementary circuit component in the integrated circuit design; and
an input pattern generator configured for adapting the identified one or more stress conditions to include the identified locations of the at least one identified elementary circuit component.

20. The system of claim 19, wherein the input pattern generator is further configured for storing the one or more stress conditions for subsequent use to stress the at least one identified elementary circuit component.

21. The system of claim 19, wherein the integrated circuit design library further includes a standard cell library configured for storing standard cells of the integrated circuit design.

22. The system of claim 19, further comprising a stress candidate list generator configured for storing elementary circuit components to be stressed and corresponding electrical connectivities in the integrated circuit design.

* * * * *